US008992247B2

(12) United States Patent
Aekins

(10) Patent No.: US 8,992,247 B2
(45) Date of Patent: Mar. 31, 2015

(54) MULTI-SURFACE CONTACT PLUG ASSEMBLIES, SYSTEMS AND METHODS

(71) Applicant: Robert A. Aekins, Quaker Hill, CT (US)

(72) Inventor: Robert A. Aekins, Quaker Hill, CT (US)

(73) Assignee: Ortronics, Inc., New London, CT (US)

( * ) Notice: Subject to any disclaimer, the term of this patent is extended or adjusted under 35 U.S.C. 154(b) by 91 days.

(21) Appl. No.: 13/832,147

(22) Filed: Mar. 15, 2013

(65) Prior Publication Data

US 2014/0273658 A1   Sep. 18, 2014

(51) Int. Cl.
*H01R 4/24* (2006.01)
*H01R 24/64* (2011.01)
*H01R 43/20* (2006.01)

(52) U.S. Cl.
CPC ............. *H01R 24/64* (2013.01); *H01R 43/205* (2013.01)
USPC ........................................................ 439/418

(58) Field of Classification Search
USPC ......................................... 439/418, 76.1, 951
See application file for complete search history.

(56) References Cited

U.S. PATENT DOCUMENTS

| | | | | |
|---|---|---|---|---|
| 3,396,461 A | * | 8/1968 | Spooner et al. | 29/827 |
| 3,706,065 A | * | 12/1972 | Knitter et al. | 439/79 |
| 5,270,964 A | * | 12/1993 | Bechtolsheim et al. | 365/52 |
| 6,116,943 A | * | 9/2000 | Ferrill et al. | 439/418 |
| 6,227,911 B1 | | 5/2001 | Boutros et al. | |
| 6,682,363 B1 | * | 1/2004 | Chang | 439/409 |
| 6,962,503 B2 | | 11/2005 | Aekins | |
| 7,322,860 B2 | | 1/2008 | Martich et al. | |
| 7,857,635 B2 | * | 12/2010 | Goodrich et al. | 439/76.1 |
| 7,916,486 B2 | * | 3/2011 | Takahashi | 361/720 |
| 8,690,598 B2 | * | 4/2014 | Bolouri-Saransar et al. | 439/404 |
| 8,696,369 B2 | * | 4/2014 | Mattson et al. | 439/131 |
| 2005/0059291 A1 | * | 3/2005 | Wood | 439/418 |
| 2012/0238153 A1 | | 9/2012 | Pachon et al. | |

OTHER PUBLICATIONS

PCT International Search Report and PCT Written Opinion from PCT/US14/24275 dated Jul. 7, 2014.

* cited by examiner

*Primary Examiner* — Gary Paumen
(74) *Attorney, Agent, or Firm* — McCarter & English, LLP

(57) ABSTRACT

Exemplary embodiments are directed to electrical plug assemblies that generally include a plug housing that defines an internal cavity. The electrical plug assemblies generally include a printed circuit board disposed within the internal cavity of the plug housing. The printed circuit board defines a front face and a bottom face. The electrical plug assemblies generally include a plurality of conductive contacts. Each of the plurality of conductive contacts is generally secured relative to the printed circuit board and extends from the bottom face to the front face of the printed circuit board. Exemplary embodiments are also directed to methods of fabricating electrical plug assemblies and electrical plug systems.

21 Claims, 12 Drawing Sheets

MULTI-SURFACE CONTACT PLUG ASSEMBLIES, SYSTEMS AND METHODS

TECHNICAL FIELD

The present disclosure relates to plug assemblies, systems and methods and, in particular, to multi-surface contact plug assemblies for making an electrical connection with different jack configurations.

BACKGROUND

In the field of communications, a variety of cables are implemented to interconnect, e.g., telecommunications equipment, data equipment, and the like. Cables generally differ in the type of plug utilized for electrically connecting the cable to the respective jack. As is known by those of ordinary skill in the art, registered jack (RJ) style plugs typically include a plug housing and a plurality of contacts for making an electrical connection to the contacts of a respective jack.

RJ style plugs are generally capable of making an electrical connection to a jack having bent cantilever and reverse cantilever style modular wire contacts when they are fabricated with metallic blade contacts. For example, as shown in FIGS. 1A and 1B (prior art), RJ plugs 10 generally include a plug housing 12 and a latch 14 for detachably securing the plug 10 within a jack 30. The plug housing 12 generally receives a cable 16 which includes a plurality of internal wires 18 electrically connected to larger conductive contacts 20. The complementary jack 30 generally defines a cavity for receiving the RJ plug 10 and further includes a base 32 and a rear wall 34 for supporting wire contacts 36.

FIG. 1A illustrates modular wire contacts 36 of jack 30 in a reverse cantilever configuration and FIG. 1B illustrates modular wire contacts 36 of jack 30 in a bent cantilever configuration. As is known in the industry, when an RJ plug 10 is inserted into an appropriate jack 30, an electrical connection is created due to contact and/or mating of the conductive contacts 20 of the RJ plug 10 and the wire contacts 36 of the jack 30. In particular, as can be seen in FIGS. 1A and 1B, the large conductive contacts 20 of RJ plugs 10 allow such RJ plugs 10 to be inserted into a jack 30 having either a bent cantilever or a reverse cantilever configuration of the modular wire contacts 36 when the modular wire contacts 36 are metallic blade contacts, while maintaining the electrical connection between the RJ plug 10 and the jack 30.

FIG. 1C (prior art) illustrates a typical RJ plug 40 which includes an integrated printed circuit board (PCB) 50. In particular, the RJ plug 40 includes a plug housing 42 and a latch 44. The housing 42 includes a cavity for receiving a cable 46 with a plurality of internal wires 56 which are electrically connected to an inserted module 48 and the PCB 50 by insulation-displacement connectors (IDCs) 54. In general, PCB 50 includes single surface conductive contacts 52 located along a single surface of the PCB 50. Typically, a PCB-integrated RJ plug 40 is only capable of making an electrical connection with a reverse cantilever style jack 30, unless extended metallic blade structures for the contacts are incorporated. Thus, as can be seen from FIG. 1C, a PCB-integrated RJ plug 40 inserted into a jack 30 having bent cantilever wire contacts 36 cannot create an electrical connection because the single surface conductive contacts 52 of RJ plug 40 do not mate with the bent cantilever wire contacts 36 of jack 30. The lack of compatibility between PCB-integrated RJ plugs 40 and jacks 30 having bent cantilever wire contacts 36 is disadvantageous for several reasons, e.g., such incompatibility results in the need for an increased amount of cables for making desired electrical connection between devices in communication systems, an increased cost for maintaining communication systems, and/or increased complexity in effectuating the installation of communication systems.

Thus, a need exists for PCB-integrated plug assemblies which are compatible with a variety of jack configurations, including jacks having bent cantilever and reverse cantilever wire contacts. These and other needs are addressed by the assemblies, systems and methods of the present disclosure.

SUMMARY

In accordance with embodiments of the present disclosure, exemplary electrical plug assemblies are provided that generally include a plug housing that defines an internal cavity and is configured as, e.g., a registered jack (RJ) plug, and the like. In general, the exemplary electrical plug assemblies include a printed circuit board (PCB) disposed within the internal cavity of the plug housing. The PCB defines a front face and a bottom face. The exemplary electrical plug assemblies further include a plurality of conductive contacts. Each of the plurality of conductive contacts can be secured relative to the PCB, e.g., to expose conductive portions of the PCB, and extends from the bottom face to the front face of the PCB.

The exemplary electric plug assemblies generally include at least one cable, e.g., a twisted pair structure cable, and the like. In general, the exemplary electrical plug assemblies include a plurality of insulation-displacement connectors (IDCs) connecting the exposed conductive portions of the PCB to the at least one cable. The plug housing generally includes a plurality of channels configured and dimensioned to receive modular wire contacts, e.g., bent cantilever contacts, reverse cantilever contacts, and the like, of a jack. The plurality of conductive contacts extending from the bottom face to the front face of the PCB can be configured to create an electrical connection between the electrical plug and, e.g., a bent cantilever jack, a reverse cantilever jack, and the like. Each of the plurality of conductive contacts can include, e.g., a single-structure conductive strip, an electrical via hole and/or conductive strip combination, and the like.

In accordance with embodiments of the present disclosure, exemplary methods of fabricating an electrical plug assembly are provided that generally include providing a plug housing that defines an internal cavity. The exemplary methods generally include inserting a PCB within the internal cavity of the plug housing. The PCB generally defines a front face and a bottom face. In general, the exemplary methods include securing each of a plurality of conductive contacts relative to the PCB. Each of the plurality of conductive contacts extends from the bottom face to the front face of the PCB.

The exemplary methods generally include securing each of the plurality of conductive contacts relative to exposed conductive portions of the PCB and creating an electrical connection between the exposed conductive portions of the PCB and at least one cable with a plurality of IDCs. In general, the exemplary methods include creating an electrical connection between the electrical plug and jack, e.g., a bent cantilever jack, a reverse cantilever jack, and the like.

In accordance with embodiments of the present disclosure, exemplary electrical plug systems are provided that generally include an electrical plug assembly that includes a plug housing that defines an internal cavity. The exemplary electrical plug further includes a PCB disposed within the internal cavity of the plug housing. The PCB defines a front face and a bottom face. The exemplary electrical plug further includes a plurality of conductive contacts. The exemplary systems generally include a jack, e.g., a bent cantilever jack, a reverse cantilever jack, and the like, configured and dimensioned to receive the electrical plug assembly. Each of the plurality of conductive contacts can be secured relative to the PCB and extends from the bottom face to the front face of the PCB. The jack generally includes a plurality of contacts, e.g., wire contacts, and the like. An electrical connection can generally be created between the plurality of contacts of the jack and the plurality of conductive contacts of the PCB. Thus, as will be discussed in greater detail below, the exemplary PCB-integrated plug assemblies are compatible with a variety of jack configurations, including jacks having bent cantilever and reverse cantilever wire contacts.

Other objects and features will become apparent from the following detailed description considered in conjunction with the accompanying drawings. It is to be understood, however, that the drawings are designed as an illustration only and not as a definition of the limits of the invention.

BRIEF DESCRIPTION OF THE DRAWINGS

To assist those of skill in the art in making and using the disclosed assemblies and associated systems and methods, reference is made to the accompanying figures, wherein.

DESCRIPTION OF EXEMPLARY EMBODIMENT(S)

In accordance with embodiments of the present disclosure, exemplary electrical plug assemblies and associated systems and methods are provided. The exemplary electrical plug assemblies generally include a plug housing that defines an internal cavity and is configured as, e.g., a RJ plug, and the like. In general, the exemplary electrical plug assemblies include a PCB disposed within the internal cavity of the plug housing. The PCB defines a front face and a bottom face. The exemplary electrical plug assemblies further include a plurality of conductive contacts. Each of the plurality of conductive contacts can be secured relative to the PCB, e.g., to exposed conductive portions of the PCB, and extends from the bottom face to the front face of the PCB.

As will be discussed in greater detail below, the exemplary multi-surface contact PCB plug assembly provides a controlled and/or low noise device for usage with high frequency transmission media, e.g., an RJ type plug interface system, such as twisted pair structure cabling, and the like. For example, the twisted pair structure cabling can be unshielded twisted pair patch cables. In particular, the exemplary modular electrical plug can provide a low cost alternative for typical RJ plugs by making an electrical connection between the exemplary plug and jacks having modular connectors of various pin contact types, e.g., bent cantilever contacts, reverse cantilever contacts, and the like. The electrical connection to the different wire contact styles can be made without external metallic blades and generally includes a metallic flat contact clip design. The exemplary electrical plug generally provides a low contact height and minimizes electrical noises for high frequency network connections.

Figure 1A:
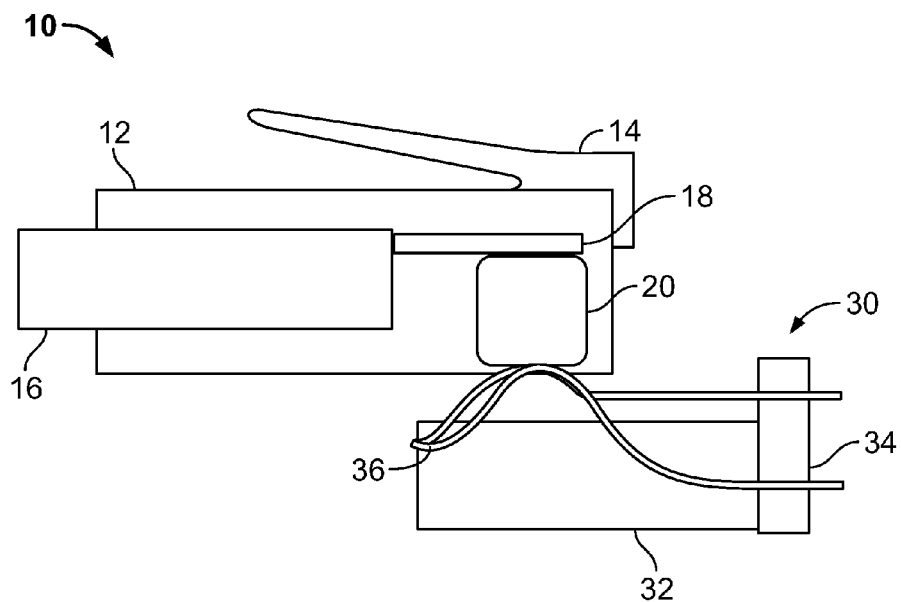
FIGS. 1A-C show plug assemblies of the prior art as implemented with reverse cantilever and bent cantilever jack configurations.
Figure 1B:
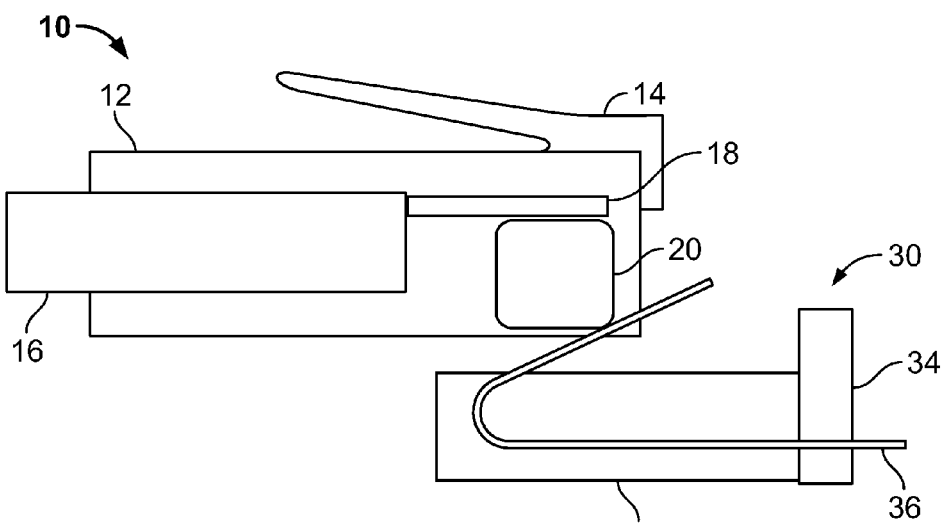
Figure 1C:
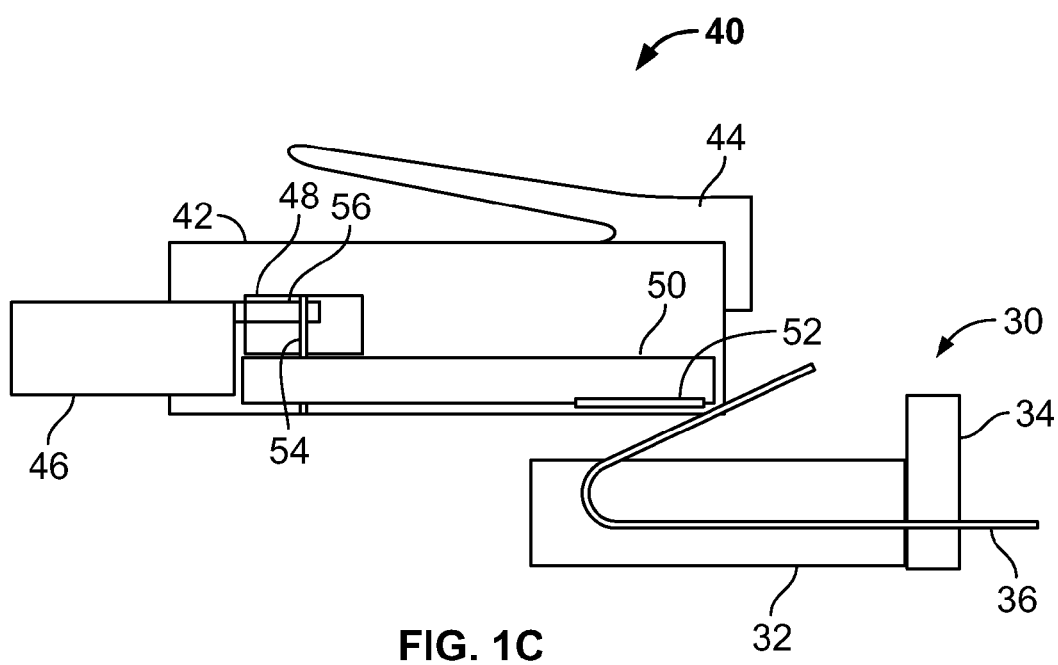
Figure 2:
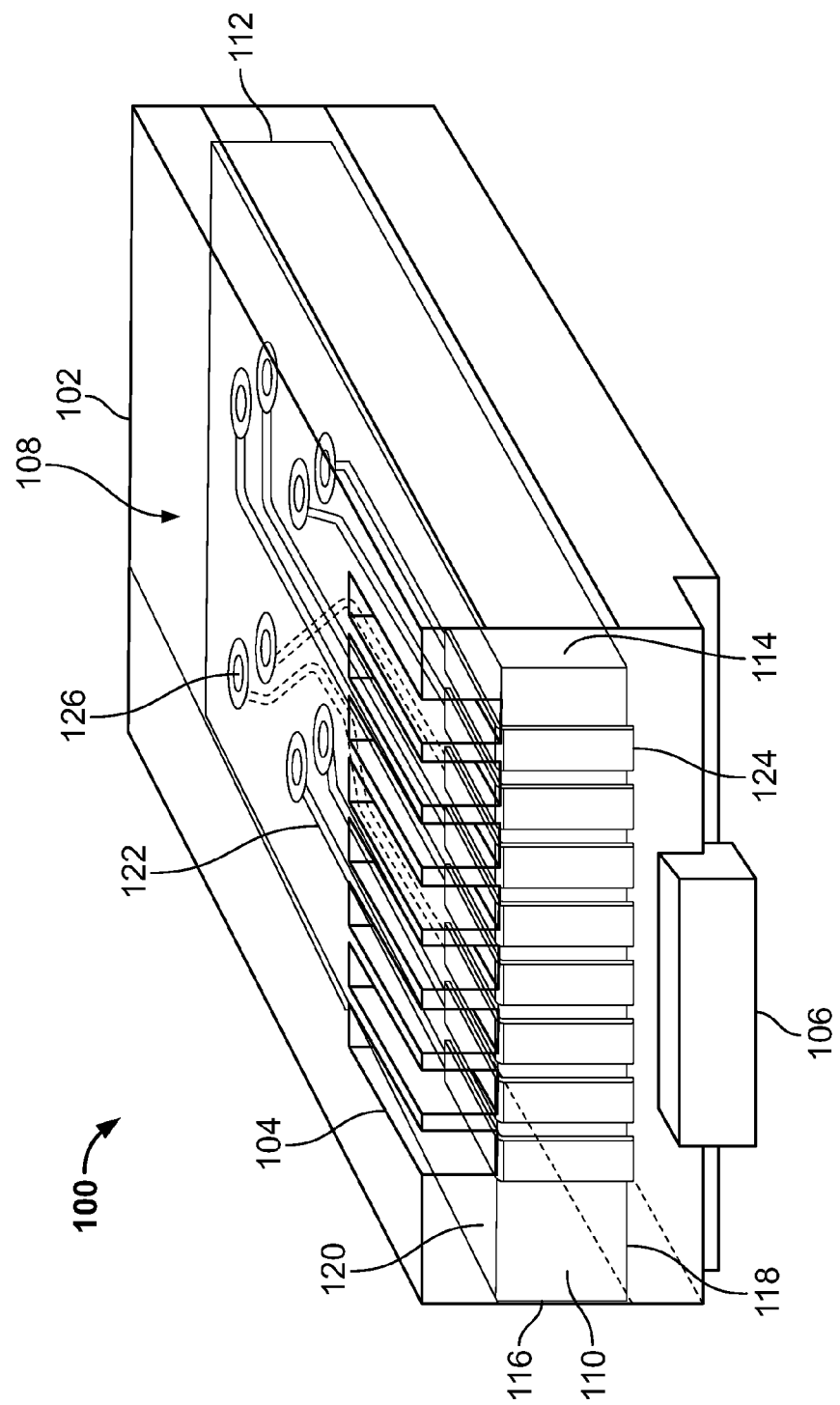
FIG. 2 is a perspective view of an exemplary electrical plug assembly according to the present disclosure.

With reference to FIG. 2, an exemplary electrical plug assembly 100 (hereinafter "assembly 100") is provided that generally includes a plug housing 102 that defines an internal cavity configured and dimensioned to receive therein a PCB 108. The plug housing 102 includes a plurality of channels 104 configured and dimensioned to align with and create an opening leading to a plurality of conductive contacts 124 secured to the PCB 108. The plug housing 102 further includes a latch 106 configured and dimensioned to detachably interlock relative to a complementary latch groove located in a jack (not shown) when the assembly 100 has been inserted into the jack.

The PCB 108 generally defines a front face 110, a rear face 112, two side faces 114 and 116, a top face 118 and a bottom face 120. The top face 118, bottom face 120 and/or the internal layers of the PCB 108 include a plurality of exposed conductive portions 122 thereon, e.g., conductive pathways, tracks, signal traces etched from copper, and the like. Electrical via holes 126 can be implemented to create electrical connections between the conductive portions 122 located on the top and bottom faces 118 and 120 of the PCB 108 and/or between the layers of conductive portions 122 located within the PCB 108. The conductive contacts 124 are secured to the front and bottom faces 110 and 120 of the PCB 108 such that an electrical connection is created between the conductive contacts 124 and the conductive portions 122 of the PCB 108.

The plurality of channels 104 of the plug housing 102 create an opening configured and dimensioned to receive therethrough wire contacts of a jack, e.g., a bent cantilever jack, a reverse cantilever jack, and the like, such that the wire contacts of the jack mate with the conductive contacts 124 and create an electrical connection between the assembly 100 and the jack.

Figure 3:
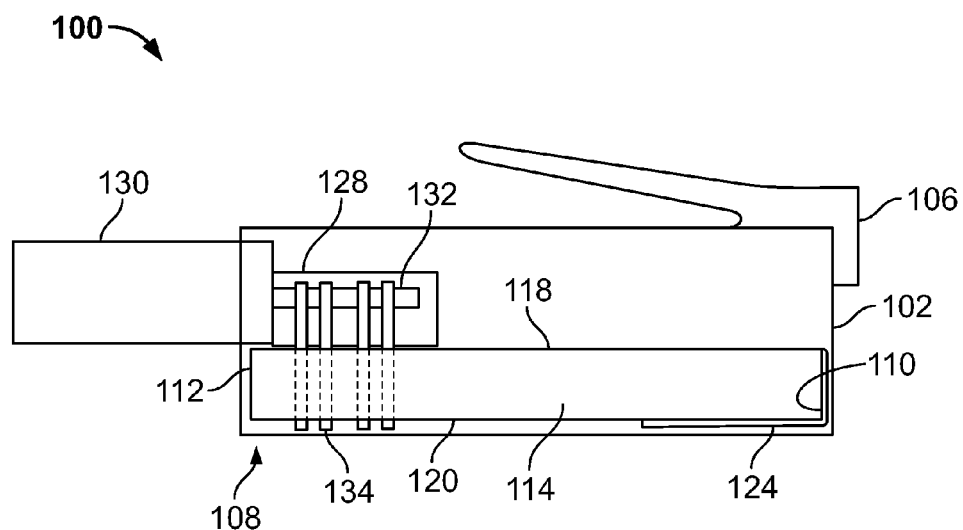
FIG. 3 is a side view of an exemplary electrical plug assembly according to the present disclosure.

FIG. 3 illustrates a side view of the exemplary assembly 100. As discussed above, the internal cavity of the plug housing 102 is configured and dimensioned to receive therein the PCB 108. In addition, the internal cavity of the plug housing can be configured and dimensioned to receive therein at least a portion of a cable 130 and an insert module 128 for connecting the plurality of internal wires 132 of the cable 130 to the PCB 108. As illustrated in FIG. 3, the plurality of internal wires 132, e.g., twisted pair cables, and the like, pass from the cable 130 into the insert module 128 and are electrically connected to the PCB 108 by IDCs 126. The IDCs 126 pass through the thickness of the PCB 108 to create an electrical connection between the conductive portions 122 located on the top and bottom surfaces 118 and 120 of the PCB 108.

FIG. 3 further illustrates the positioning of the conductive contacts 124 relative to the PCB 108. In particular, the conductive contacts 124 connect to the front face 110 of the PCB 108 and wrap around the PCB 108 to connect to the bottom face 120 of the PCB 108. Thus, the conductive contacts 124 extend from the front face 110 to the bottom face 120 of the PCB 108 to create two conductive surfaces compatible for mating with a variety of wire contacts, e.g., terminal pins, of a jack.

Figure 4:
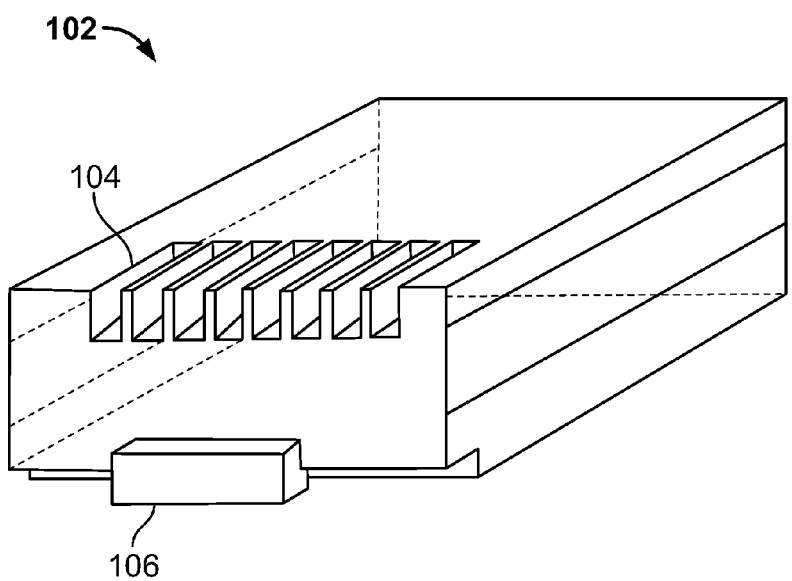
FIG. 4 is a perspective view of an exemplary plug housing for an electrical plug assembly according to the present disclosure.

FIG. 4 illustrates a perspective view of the exemplary plug housing 102. As discussed above, the plug housing 102 includes a plurality of channels 104 and a latch 106 for detachably interlocking with a jack. As would be understood by those of ordinary skill in the art, although eight channels 104 are illustrated, in some exemplary embodiments, the number of channels 104 can vary depending on the number of conductive contacts 124 being implemented.

Figure 5A:
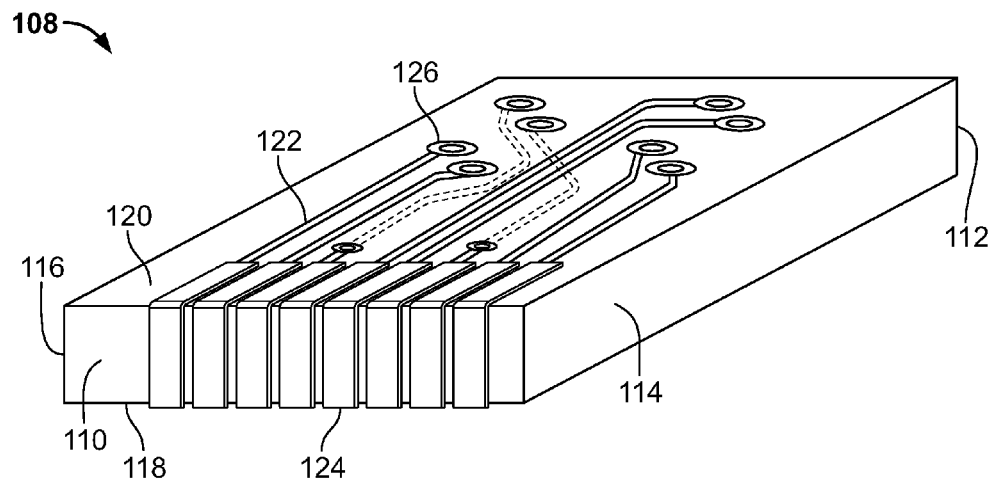
FIGS. 5A and 5B are bottom and top perspective views of an exemplary PCB for an electrical plug assembly according to the present disclosure.
Figure 5B:
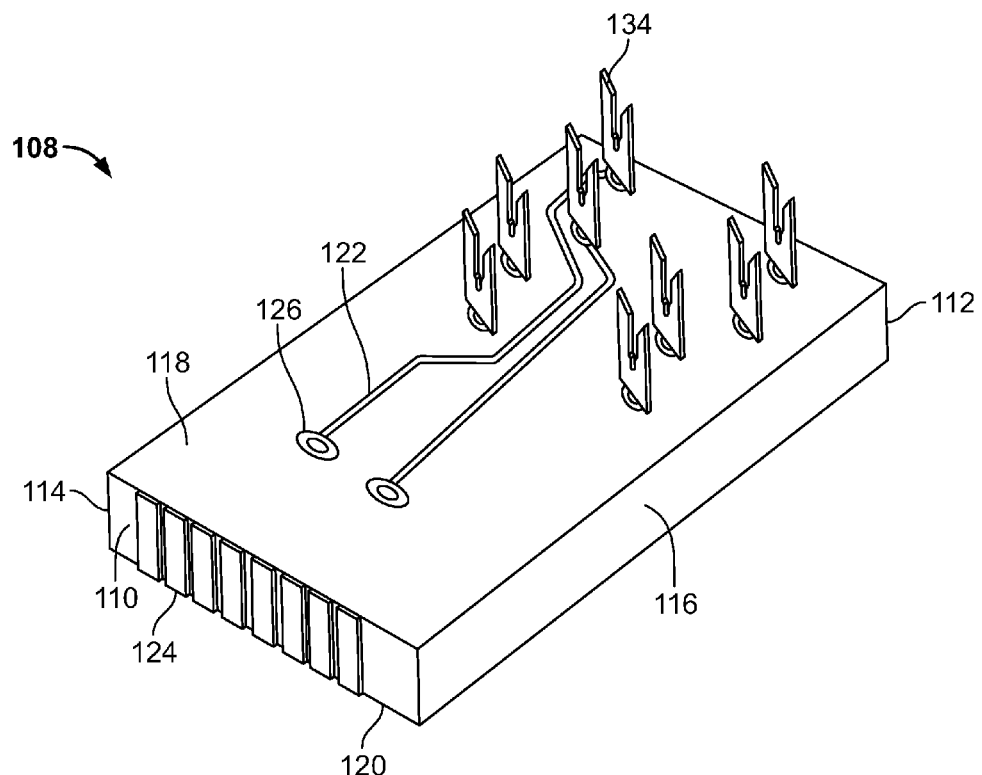

With reference now to FIGS. 5A and 5B, bottom and top perspective views of an exemplary PCB 108 are provided. In particular, FIG. 5A illustrates a perspective view of the bottom face 120 of the PCB 108 and FIG. 5B illustrates a perspective view of the top face 118 of the PCB 108. FIG. 5A further illustrates positioning of the conductive contacts 124 with respect to the PCB 108, i.e., the conductive contacts 124 electrically connect to and are positioned along the front face 110 of the PCB 108 and further wrap around the PCB 108 and connect to the bottom face 120 of the PCB 108. Thus, the conductive contacts 124 create two faces of the PCB 108 which can be implemented for creating an electrical connection with wire contacts of the jack. As can be seen in FIG. 5B, IDCs 134 can be electrically connected to the conductive portions 122 along the top face 118 of the PCB 108, which in turn electrically connect to the internal wires 132 of the cable 130.

Figure 6A:
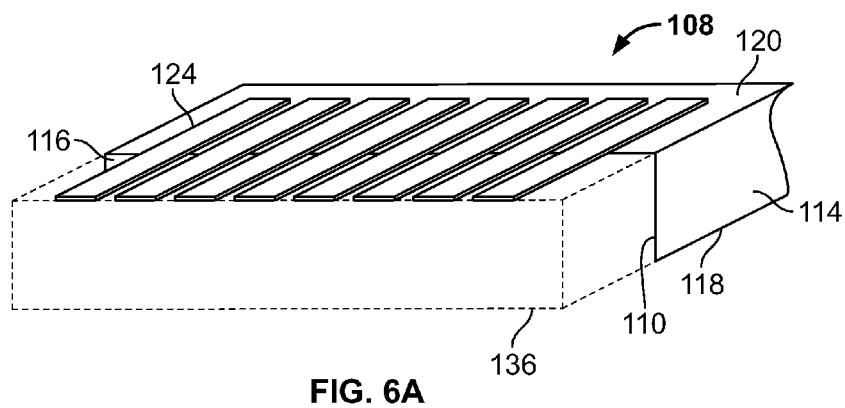
FIGS. 6A and 6B are bottom perspective views of an exemplary PCB for an electrical plug assembly according to the present disclosure.
Figure 6B:
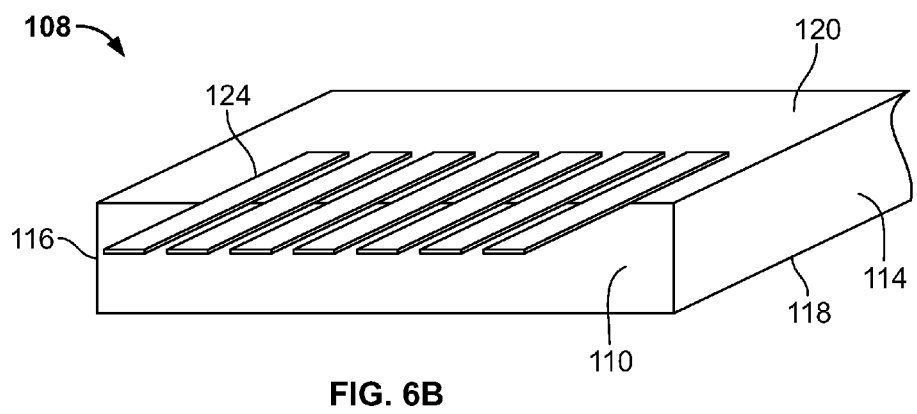

Turning now to FIGS. 6A and 6B, bottom perspective views of an exemplary PCB 108 are provided. As shown in dashed lines in FIG. 6A, a PCB of the prior art generally includes a conductive portion of the PCB and a dielectric area 136, i.e., an insulating area, positioned adjacent to the conductive portion of the PCB. The conductive contacts 124 are then positioned along only one surface of the PCB. In contrast, the exemplary PCB 108 is fabricated from a conductive material and does not include or substantially reduced dielectric portion 136. Thus, as shown in FIG. 6B, the conductive contacts 124 can be secured to the bottom surface 120 of the PCB 108 such that at least a portion of the conductive contacts 124 remains for wrapping around and securing to the front face 110 of the PCB 108.

Figure 7:
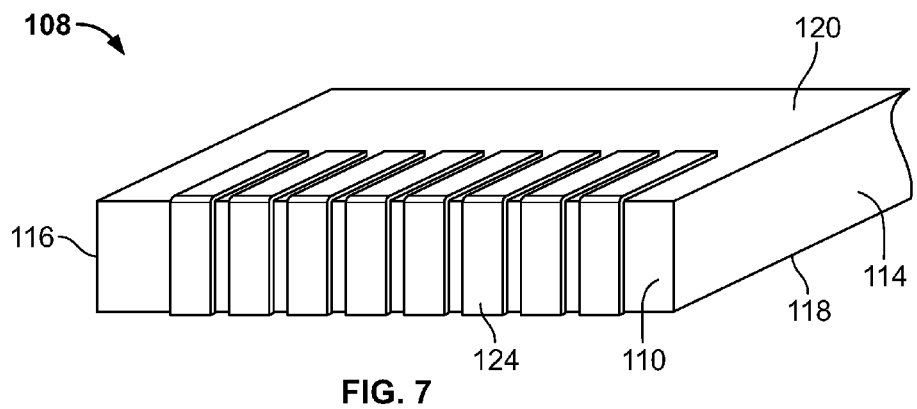
FIG. 7 is a perspective view of exemplary conductive contacts positioned on an exemplary PCB for an electrical plug assembly according to the present disclosure.

FIG. 7 illustrates an exemplary PCB 108 with conductive contacts 124 positioned and secured along the front and bottom faces 110 and 120 of the PCB 108. In particular, the conductive contacts 124 are positioned against conductive portions of the PCB 108 since the dielectric portion 136 has been removed. Thus, two surfaces of the PCB 108, i.e., the front and bottom faces 110 and 120, act as exposed conductive surfaces of the PCB 108 for mating with wire contacts of a jack to create an electrical connection between the assembly 100 and the jack.

Figure 8A:
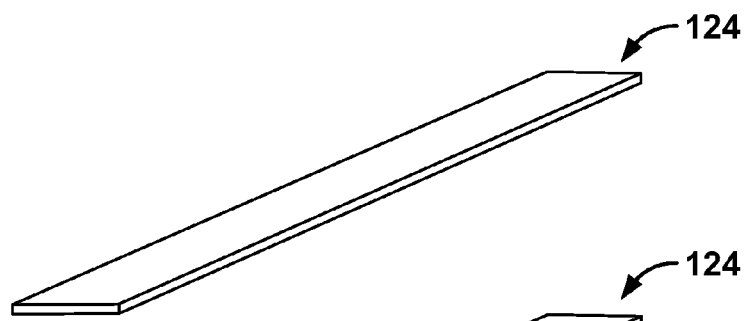
FIGS. 8A and 8B are perspective views of exemplary conductive contacts for an electrical plug assembly according to the present disclosure.
Figure 8B:
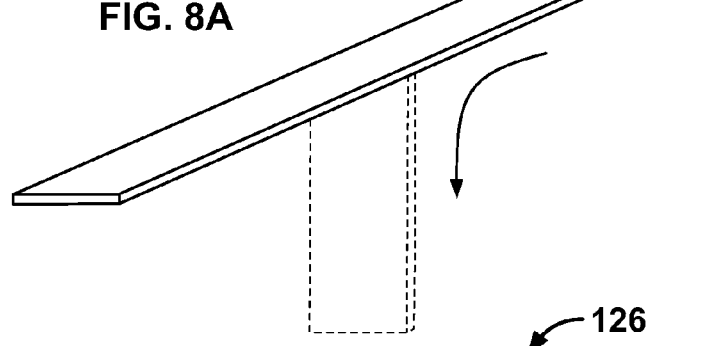

FIGS. 8A and 8B illustrate an exemplary conductive contact 124, e.g., a conductive contact strip, in its normal and rearranged position. In particular, FIG. 8A illustrates the planar configuration of the conductive contact 124 as generally utilized in PCBs of the prior art, while FIG. 8B illustrates the exemplary conductive contact 124 rearranged to wrap around a front corner of the PCB 108 to electrically connect to the front and bottom surfaces 110 and 120 of the PCB 108, i.e., a dual horizontal and vertical surface contact position. As would be understood by those of ordinary skill in the art, while the conductive contact 124 may initially be configured in a substantially planar orientation, the exemplary double-contact configuration of the conductive contact 124 can be created by bending the conductive contact 124 in the direction indicated in FIG. 8B at approximately 90°.

Figure 9A:
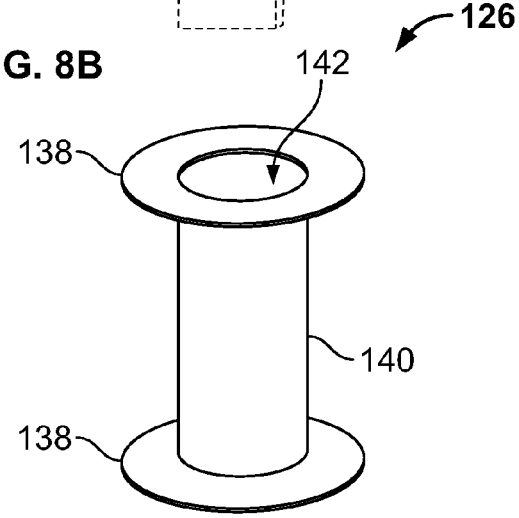
FIGS. 9A and 9B are perspective views of an exemplary electrical via hole for an electrical plug assembly according to the present disclosure.
Figure 9B:
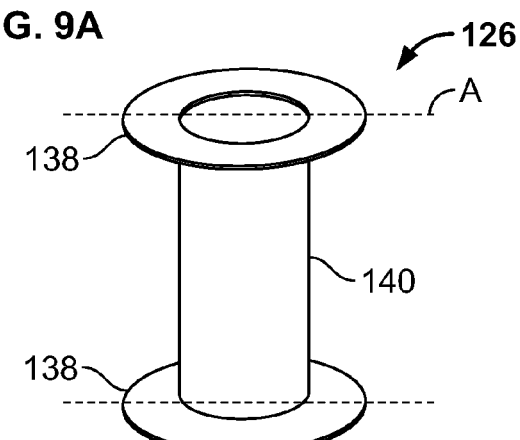

FIGS. 9A and 9B illustrate perspective views of an exemplary electrical via hole 126 of a PCB 108 which can be utilized as part of a conductive contact. The electrical via hole 126 generally includes two pads 138 connected to and positioned at opposing ends of a tube 140, e.g., a conductive tube, and the like. The tube 140 defines a cavity 142 therein. The pads 138 can be fabricated from a conductive material and connect to the conductive portions 122 of the PCB 108 by, e.g., soldering, and the like. Thus, the pads 138 and tube 140 can electrically connect conductive portions 122 located on different faces and/or layers of the PCB 108.

Figure 10A:
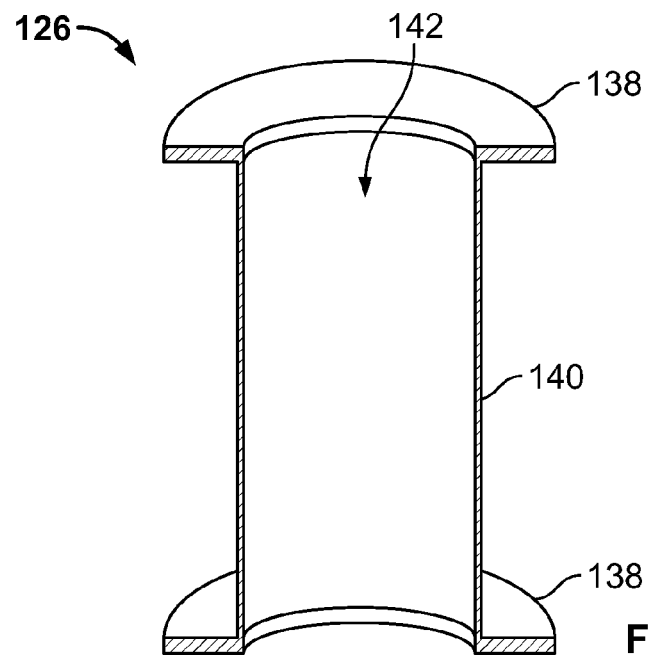
FIGS. 10A and 10B are perspective views of an exemplary electrical via hole for an electrical plug assembly according to the present disclosure.
Figure 10B:
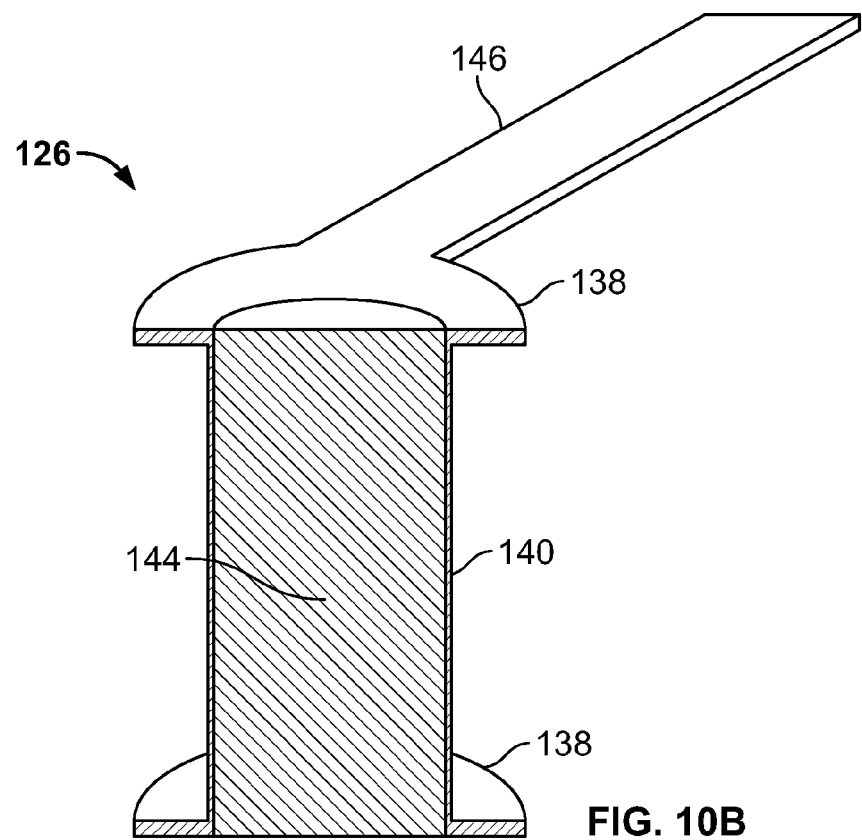

In some exemplary embodiments, the electrical via hole 126 can be cut or split along plane "A" (see FIG. 9B) to create a vertical electrical exposure of the electrical via hole 126. For example, FIG. 10A illustrates the electrical via hole 126 cut along plane "A" to expose the cavity 142 within the tube 140. As shown in FIG. 10B, the exposed cavity 142 can then be filled with solder 144 to create a conductive surface along the vertical exposed end of the electrical via hole 126 between the two pads 138. In some exemplary embodiments, rather than cutting and filling the electrical via hole 126, a solid conductive tube can be implemented. A conductive strip 146, e.g., a horizontal conductive strip, can then be electrically connected, e.g., soldered, to one of the pads 138. It should be understood that the conductive strip 146, in combination with the solder-filled electrical via hole 126, forms a conductive contact substantially similar to the conductive contact 124 discussed above. In particular, the conductive strip 146 and the solder-filled electrical via hole 126 create a double-contact configuration along two surfaces of the PCB 108. For example, the conductive strip 146 can be positioned along the bottom surface 120 of the PCB 108 and the solder-filled electrical via hole 126 can be positioned along the front face 110 of the PCB 108, thus forming a conductive contact extending from the bottom face 120 to the front face 110 of the PCB 108.

Figure 11:
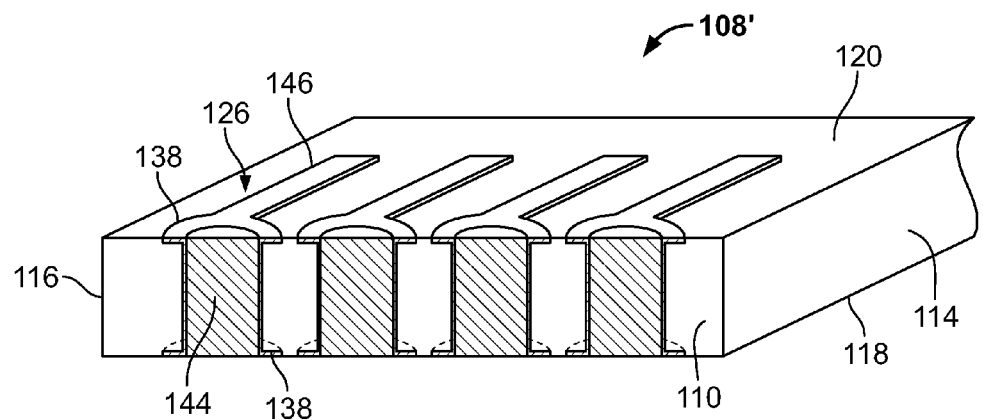
FIG. 11 is a perspective view of an exemplary PCB with electrical via holes for an electrical plug assembly according to the present disclosure.

With reference to FIG. 11, the PCB 108' is illustrated with a plurality of conductive contacts, i.e., the conductive strips 146 and the solder-filled electrical via holes 126. The PCB 108' can be substantially similar to the PCB 108 discussed above. The conductive strip 146 can be positioned and secured along the bottom face 120 of the PCB 108' and the solder-filled electrical via hole 126 can be positioned and secured along the front face 110 of the PCB 108'. The solder-filled electrical via hole 126 defines a substantially flat surface parallel to the front face 110 of the PCB 108' and further defines a smooth transition between the solder 144, the pads 138 and the conductive strip 146. The conductive strip 146 and the solder-filled electrical via hole 126 thereby function substantially similarly to the conductive strip 124 illustrated in FIG. 7. In particular, the conductive strip 146 and the solder-filled electrical via hole 126 create two electrically exposed surfaces along the PCB 108' to electrically connect to contact wires of a jack, e.g., a bent cantilever jack, a reverse cantilever jack, and the like.

Figure 12:
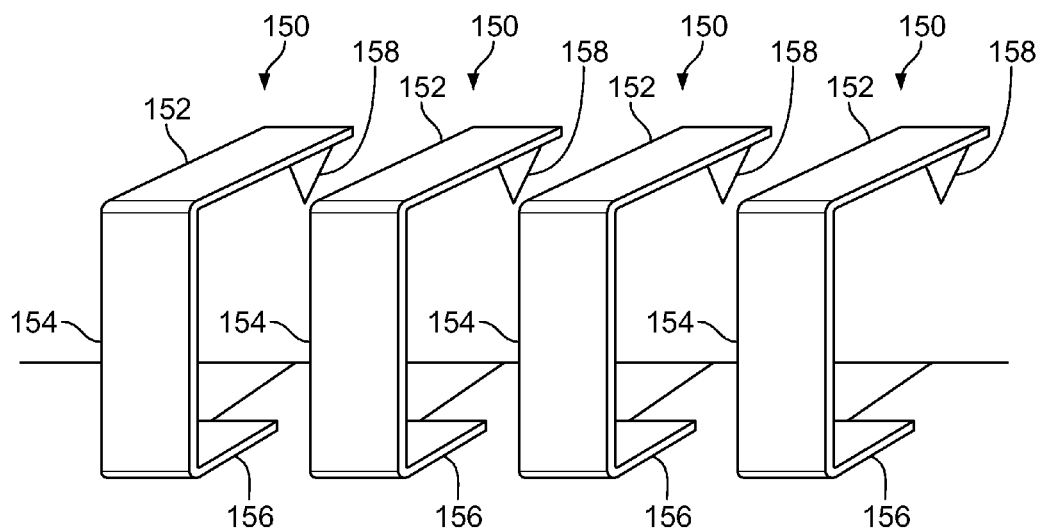
FIG. 12 is a perspective view of exemplary conductive contacts for an electrical plug assembly according to the present disclosure.
Figure 13A:
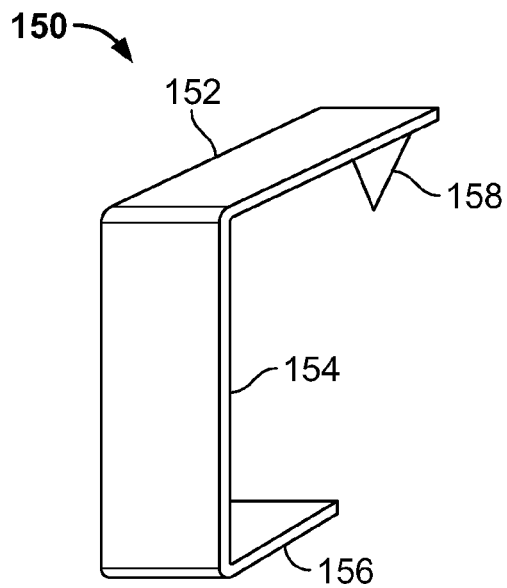
FIGS. 13A-C are perspective, rear and side views of an exemplary conductive contact for an electrical plug assembly according to the present disclosure.
Figure 13B:
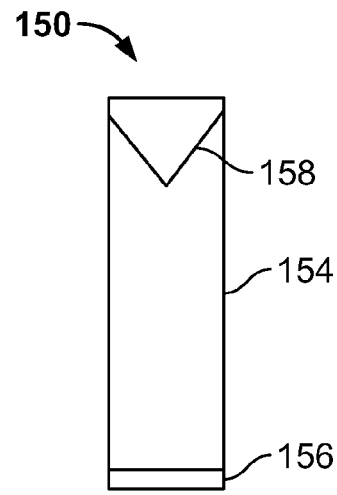
Figure 13C:
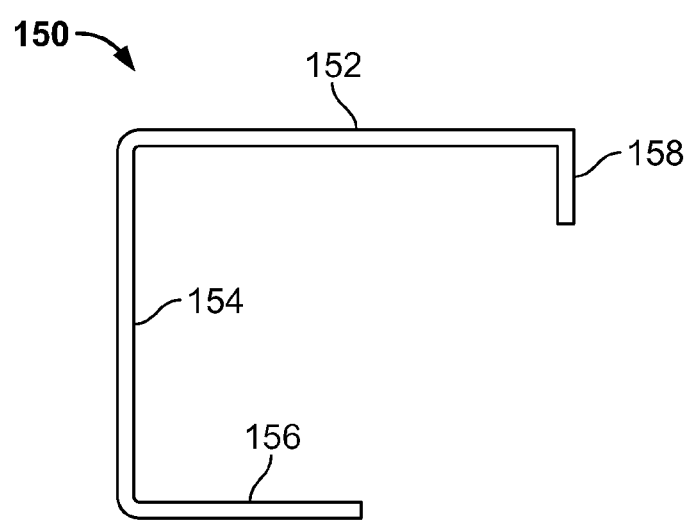

In some exemplary embodiments, as shown in FIG. 12, an exemplary conductive contact 150 may be implemented to create the double-contact configuration described above. The conductive contact 150 generally includes a top portion 156, a bottom portion 152 opposing the top portion 156, and a vertical portion 154 connecting the top portion 156 to the bottom portion 152. The conductive contact 150 may be fabricated from a single conductive strip and formed by bending the conductive strip at substantially 90° to create the configuration shown in FIG. 12. The conductive contact 150 generally also includes a connector point 158 protruding from the bottom portion 152 in the direction of the top portion 156. FIGS. 13A-C further illustrate the perspective, rear and side views of the exemplary conductive contact 150. It should be understood that the space defined by the top portion 156, vertical portion 154 and bottom portion 152 can be configured and dimensioned to receive a portion of the PCB 108.

Figure 14:
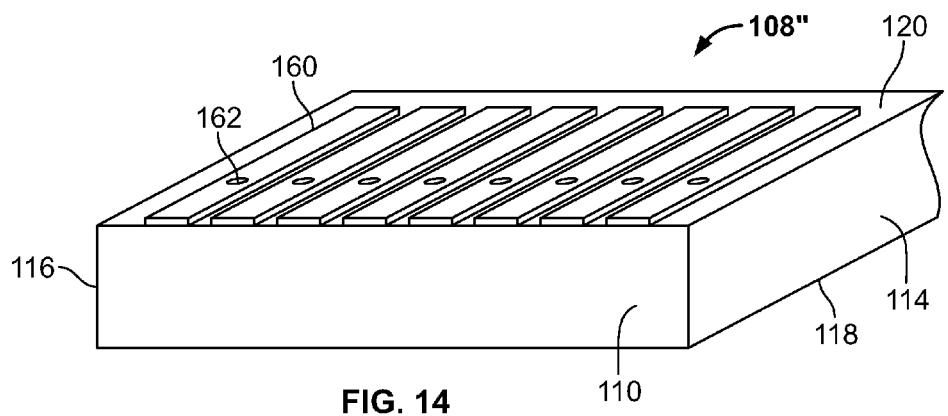
FIG. 14 is a perspective view of an exemplary PCB that includes via holes for conductive contact insertion for an electrical plug assembly according to the present disclosure.

FIG. 14 illustrates an exemplary PCB 108" substantially similar to the PCB 108 discussed above. In some exemplary embodiments, conductive strips 160 can be positioned and secured along the bottom face 120 of the PCB 108" as shown in FIG. 14. The conductive strips 160 can be electrically connected to the conductive portions of the PCB 108" (not shown). The conductive strips 160 extend along one surface of the PCB 108", align along the front face 110 of the PCB 108" and include a via hole 162 configured and dimensioned to receive and mate with the connector point 158 of the conductive contact 150.

Figure 15:
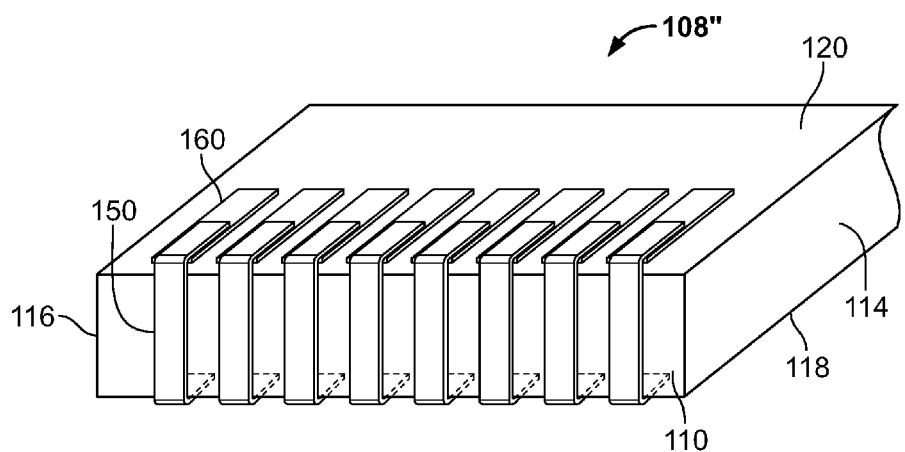
FIG. 15 is a perspective view of an exemplary PCB that includes conductive contacts for an electrical plug assembly according to the present disclosure.

FIG. 15 illustrates an exemplary assembly of the conductive contacts 150 and conductive strips 160 with the PCB 108". The connector point 158 can be inserted into and secured within the via hole 162 of the conductive strip 160. The conductive contact 150 can further be fitted around the front face 110 of the PCB 108" such that an exposed conductive surface is created along the bottom face 120, front face 110 and top face 118 of the PCB 108". In some exemplary embodiments, the conductive contact 150 can extend only along the bottom face 120 and the front face 110 of the PCB 108" to create two exposed conductive surfaces of the PCB 108" for electrical mating with wire contacts of a jack.

Figure 16A:
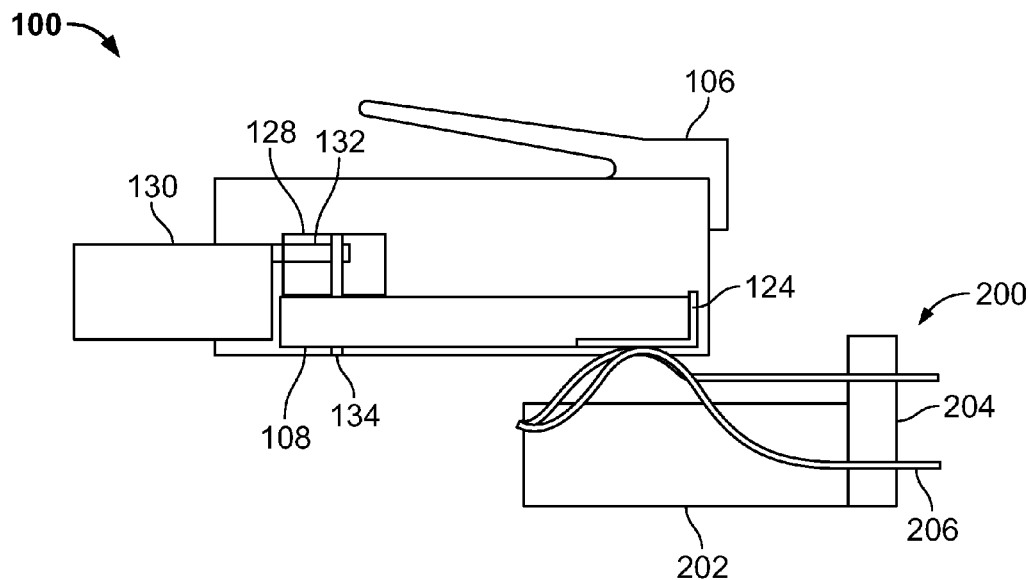
FIGS. 16A and 16B are side views of an exemplary electrical plug assembly as implemented with reverse cantilever and bent cantilever jack configurations according to the present disclosure.
Figure 16B:
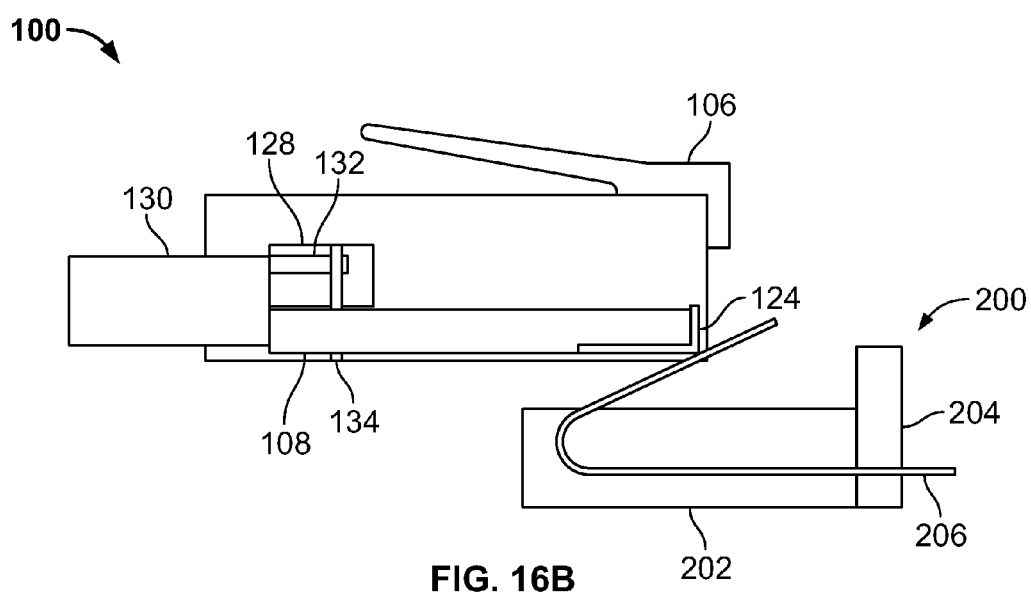

Turning now to FIGS. 16A and 16B, the exemplary assembly 100 is illustrated as implemented with a jack 200. The jack 200 generally includes a base 202 and a rear wall 204 for supporting the wire contacts 206. FIG. 16A illustrates a jack 200 with a reverse cantilever wire contacts 206 configuration and FIG. 16B illustrates a jack 200 with a bent cantilever wire contacts 206 configuration. Although the assembly 100 is illustrated with PCB 108 and conductive contacts 124, it should be understood that the exemplary assembly 100 can include, e.g., PCB 108', PCB 108", a conductive strip 146 and solder-filled electrical via hole 126, conductive contacts 150, combinations thereof, and the like.

As shown in FIGS. 16A and 16B, the exemplary assembly 100 includes an integrated PCB 108 and is compatible with jacks 200 of varying wire contact 206 configurations. With respect to FIG. 16A, when inserted into a jack 200 having a reverse cantilever wire contact 206 configuration, an electrical connection can be made between the wire contacts 206 of the jack 200 and the conductive contact 124 of the assembly 100. In particular, the conductive contact 124 positioned along the bottom face 120 of the PCB 108 provides a conductive surface with which the reverse cantilever wire contacts 206 can electrically mate. With respect to FIG. 16B, when inserted into a jack 200 having a bent cantilever wire contact 206 configuration, an electrical connection can still be made between the wire contacts 206 of the jack 200 and the conductive contact 124 of the assembly 100. In particular, the conductive contact 124 positioned along the front face 110 of the PCB 108 provides a conductive surface with which the bent cantilever wire contacts 206 can electrically mate. Thus, the exemplary assembly 100 includes a PCB 108 with two conductive surfaces which allow the assembly 100 to be compatible with jacks 200 having different wire contact 206 configurations.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The invention claimed is:

1. An electrical plug assembly, comprising:
   a plug housing that defines an internal cavity,
   a printed circuit board disposed within the internal cavity of the plug housing, the printed circuit board defining a front face and a bottom face, and
   a plurality of conductive contacts,
   wherein each of the plurality of conductive contacts is secured relative to the printed circuit board and extends from the bottom face to the front face of the printed circuit board, and
   wherein each of the plurality of conductive contacts comprises an electrical via hole and a conductive strip.

2. The electrical plug assembly of claim 1, wherein the plug housing is configured to define a registered jack plug.

3. The electrical plug assembly of claim 1, wherein each of the plurality of conductive contacts is secured to exposed conductive portions of the printed circuit board.

4. The electrical plug assembly of claim 3, further comprising at least one cable, wherein the at least one cable is a twisted pair structure cable.

5. The electrical plug assembly of claim 4, further comprising a plurality of insulation-displacement connectors electrically connecting the exposed conductive portions of the printed circuit board to the at least one cable.

6. The electrical plug assembly of claim 1, wherein the plug housing further comprises a plurality of channels.

7. The electrical plug assembly of claim 6, wherein the plurality of channels are configured and dimensioned to receive contacts of a jack.

8. The electrical plug assembly of claim 7, wherein the contacts of the jack are configured as bent cantilever contacts or reverse cantilever contacts.

9. The electrical plug assembly of claim 1, wherein the plurality of conductive contacts extending from the bottom face to the front face of the printed circuit board are configured to create an electrical connection between the electrical plug and both a bent cantilever jack and a reverse cantilever jack.

10. The electrical plug assembly of claim 1, wherein each of the plurality of conductive contacts comprises a single-structure conductive strip.

11. A method of fabricating an electrical plug assembly, comprising:
providing a plug housing that defines an internal cavity,
inserting a printed circuit board within the internal cavity of the plug housing, the printed circuit board defining a front face and a bottom face, and
securing each of a plurality of conductive contacts relative to the printed circuit board,
wherein each of the plurality of conductive contacts extends from the bottom face to the front face of the printed circuit board, and
wherein each of the plurality of conductive contacts comprises an electrical via hole and a conductive strip.

12. The method of claim 11, further comprising securing each of the plurality of conductive contacts to exposed conductive portions of the printed circuit board.

13. The method of claim 12, further comprising creating an electrical connection between the exposed conductive portions of the printed circuit board and at least one cable with a plurality of insulation-displacement connectors.

14. The method of claim 11, further comprising creating an electrical connection between the electrical plug and a jack.

15. The method of claim 12, wherein the jack is a bent cantilever jack or a reverse cantilever jack.

16. An electrical plug system, comprising:
an electrical plug assembly that includes (i) a plug housing that defines an internal cavity, (ii) a printed circuit board disposed within the internal cavity of the plug housing, the printed circuit board defining a front face and a bottom face, and (iii) a plurality of conductive contacts, and
a jack configured and dimensioned to receive the electrical plug assembly,
wherein each of the plurality of conductive contacts is secured relative to the printed circuit board and extends from the bottom face to the front face of the printed circuit board, and
wherein each of the plurality of conductive contacts comprise an electrical via hole and a conductive strip.

17. The electrical plug system of claim 16, wherein the jack is a bent cantilever jack or a reverse cantilever jack.

18. The electrical plug system of claim 16, wherein the jack includes a plurality of contacts.

19. The electrical plug system of claim 18, wherein an electrical connection is created between the plurality of contacts of the jack and the plurality of conductive contacts of the printed circuit board.

20. An electrical plug assembly, comprising:
a plug housing that defines an internal cavity,
a printed circuit board disposed within the internal cavity of the plug housing, the printed circuit board defining a front face and a bottom face, and
a plurality of conductive contacts,
wherein each of the plurality of conductive contacts is secured relative to the printed circuit board and extends from the bottom face to the front face of the printed circuit board, a bottom face portion of each of the plurality of conductive contacts extending perpendicularly relative to a front face portion of each of the plurality of conductive contacts.

21. The electrical plug assembly of claim 20, wherein each of the plurality of conductive contacts comprises an electrical via hole and a conductive strip.

\* \* \* \* \*